United States Patent
Kawata (12)

(10) Patent No.: US 6,767,691 B2
(45) Date of Patent: Jul. 27, 2004

(54) SCATTERING-RETICLE ASSEMBLIES FOR ELECTRON-BEAM MICROLITHOGRAPHY INCLUDING A SCATTERING-STENCIL RETICLE PORTION AND A SCATTERING-MEMBRANE RETICLE PORTION

(75) Inventor: Shintaro Kawata, Moriya (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 10/622,529

(22) Filed: Jul. 17, 2003

(65) Prior Publication Data

US 2004/0081916 A1 Apr. 29, 2004

Related U.S. Application Data

(62) Division of application No. 09/944,531, filed on Aug. 31, 2001, now Pat. No. 6,620,558.

(30) Foreign Application Priority Data

Aug. 31, 2000 (JP) .................................... 2000-263096

(51) Int. Cl.⁷ ............................................... G03C 5/00
(52) U.S. Cl. ...................................... 430/296; 430/942
(58) Field of Search ................................ 430/296, 942

(56) References Cited

U.S. PATENT DOCUMENTS

| 6,355,383 B1 | 3/2002 | Yamashita | 430/5 |
| 6,620,558 B2 * | 9/2003 | Kawata | 430/5 |

\* cited by examiner

*Primary Examiner*—Christopher G. Young
(74) *Attorney, Agent, or Firm*—Klarquist Sparkman, LLP

(57) ABSTRACT

Disclosed are reticle assemblies for use in electron-beam microlithography. An exemplary reticle assembly includes a scattering-stencil reticle portion and a scattering-membrane reticle portion that define respective portions of the overall pattern defined by the reticle assembly. The reticle portions desirably are mounted to a reticle frame to provide strength and rigidity to the assembly. By combining both types of reticles in a single reticle assembly, the shortcomings of each are minimized compared to a single reticle type by which the entire pattern is defined. Because fabrication processes for the two reticle types are different, the reticle types can be fabricated separately and then bonded to the reticle frame to form the reticle assembly. Also disclosed are electron-beam microlithography apparatus and methods that include use of such reticle assemblies. Compared to conventional reticle assemblies as well as conventional apparatus and methods using them, reticle assemblies as disclosed herein can reduce the need to stitch together complementary pattern portions and reduce chromatic aberrations.

3 Claims, 4 Drawing Sheets

US 6,767,691 B2

SCATTERING-RETICLE ASSEMBLIES FOR ELECTRON-BEAM MICROLITHOGRAPHY INCLUDING A SCATTERING-STENCIL RETICLE PORTION AND A SCATTERING-MEMBRANE RETICLE PORTION

CROSS REFERENCE TO RELATED APPLICATIONS

This is a divisional of and claims priority to U.S. patent application Ser. No. 09/944,531, filed Aug. 31, 2001, now U.S. Pat. No. 6,620,558 which is incorporated in its entirety by reference herein.

TECHNICAL FIELD

This disclosure pertains to microlithography, which involves projection-transfer of a pattern, defined by a reticle or mask, to a "sensitive" substrate using an energy beam. By "sensitive" is meant that the substrate is imprintable with an image carried from the reticle to the substrate by the energy beam. More specifically, this disclosure pertains to reticles as used in microlithography in which the energy beam is an electron beam.

BACKGROUND

As noted above, in projection microlithography the pattern is defined on a reticle or mask (termed a "reticle" herein) and is projected onto the sensitive substrate. For electron-beam (EB) microlithography, various types of reticles have been devised, including "absorption" reticles and several types of "scattering" reticles.

Scattering reticles generally are of two types: "scattering-stencil" reticles and "scattering-membrane" reticles. A scattering-stencil reticle comprises an electron-beam-scattering (EB-scattering) membrane, usually made of silicon (Si), that defines pattern elements by corresponding EB-transmissive through-holes in the membrane. A scattering-membrane reticle comprises a thin EB-transmissive membrane, usually made of silicon nitride (SiN), on which pattern elements are defined by corresponding portions ("scattering bodies") of a thin EB-scattering layer (e.g., tungsten (W) or chromium (Cr)) on the SiN membrane. An "absorption" reticle is constructed similarly to the scattering-membrane reticle, except that pattern elements are defined by corresponding "absorption bodies" of a EB-absorbing material (e.g., heavy metal) on a EB-transmissive membrane.

A scattering reticle is used in a different manner than an absorption reticle. With an absorption reticle, portions of the incident beam are absorbed by the EB-absorbing bodies, which can cause localized heating of the reticle. With a scattering reticle, in contrast, the incident electron beam is scattered (mostly forward-scattered) as it passes through various portions of the reticle, rather than being absorbed by the reticle. The resulting scattering contrast defines pattern elements as imaged on the substrate. Since few of the incident electrons are absorbed, the temperature of a scattering reticle can be kept relatively low compared to an absorption reticle, with a corresponding increase in the accuracy of pattern transfer.

With a scattering-stencil reticle, the incident electrons that pass through the through-holes of the reticle (and that do not interact with the reticle and become scattered, for example) are used for transfer and exposure. Hence, the full capacity of the EB-optical system can be used, with a corresponding increase in imaging resolution. A disadvantage of scattering-stencil reticles, however, is the fact that certain pattern elements (e.g., donut-shaped elements, peninsular-shaped elements, certain longitudinally extended elements) cannot be defined entirely in a single corresponding portion of the reticle. Rather, complete definition of such a pattern element on the reticle requires use of complementary portions of the reticle each defining a respective portion of the element. As exposed onto the substrate, the images of the complementary pattern portions must be "stitched" together properly to create the entire respective pattern element. The unusually high stitching accuracy required poses a problem with using this type of reticle.

Scattering-membrane reticles also have problems, notably the fact that some of the energy of the incident electrons passing through the thin EB-transmissive membrane is absorbed by the scattering bodies. This energy absorption not only increases the temperature of the reticle but also results in increased chromatic aberration of the electron beam propagating downstream of the reticle. I.e., the chromatic aberration arises from energy of the incident beam being absorbed by certain regions of the reticle relative to other regions.

SUMMARY

In view of the foregoing, an object of the invention to provide, inter alia, scattering-reticle assemblies for use in electron-beam (EB) microlithography of a pattern, defined by the reticle assembly, to a substrate. An embodiment of such a reticle assembly comprises at least one scattering-stencil reticle portion defining a respective portion of the pattern, and at least one scattering-membrane reticle portion defining a respective portion of the pattern. Typically, the reticle assembly is of a "divided" reticle, wherein each of the scattering-stencil reticle and scattering-membrane reticle portions is segmented into respective subfields. Also, the reticle assembly desirably further comprises a support frame, wherein the at least one scattering-stencil reticle portion and the at least one scattering-membrane reticle portion are bonded to respective locations on the support frame.

Each scattering-stencil reticle portion typically comprises a respective reticle membrane made of silicon, wherein pattern elements are defined by respective through-holes in the reticle membrane. Each scattering-membrane reticle portion typically comprises a respective reticle membrane made of Si, SiC, SiN, carbon, diamond, BN, or a mixture thereof. Each scattering-membrane reticle portion typically further comprises a respective pattern-defining layer on the respective reticle membrane. The pattern-defining layer desirably is made of a material such as chromium (Cr), tungsten (W), tantalum (Ta), or a mixture thereof. Further desirably, each respective pattern-defining layer has a transmittance to electrons of an incident electron beam of no more than one-tenth of the respective reticle membrane.

The reticle assembly can comprise a first scattering-stencil reticle portion, a second scattering-stencil reticle portion, and a scattering-membrane reticle portion. In such a configuration, the second scattering-stencil reticle portion usually comprises subfields defining respective pattern features that are complementary to respective pattern features defined in subfields of the first scattering-stencil reticle portion.

Also provided are EB microlithography apparatus. An embodiment of such an apparatus includes an illumination system, a projection system, and a scattering-reticle assembly. The illumination system is situated and configured to receive an illumination beam from an EB source and to direct the illumination beam to a selected region on the reticle assembly. The projection system is situated and configured to direct a portion of the beam passing through the reticle assembly to a substrate. The scattering-reticle assembly is situated on a reticle stage so as to be illuminated by the illumination beam. The scattering-reticle assembly comprises at least one scattering-stencil reticle portion defining a respective portion of the pattern, and at least one scattering-membrane reticle portion defining a respective portion of the pattern. Each of the scattering-stencil reticle and scattering-membrane reticle portions of the reticle assembly can be configured as summarized above with respect to reticle assemblies.

Also provided are improvements to EB microlithographic exposure methods in which an electron beam is directed to a reticle assembly (that defines a pattern) by which the beam acquires an ability to form an image of the pattern on a substrate. On the reticle assembly a first pattern portion is defined on at least one scattering-stencil reticle portion, and a second pattern portion is defined on at least one scattering-membrane reticle portion. Using the electron beam, the pattern portions from each reticle portion are transferred to the substrate so as to produce a stitched-together image of the pattern on the substrate.

Characteristic of a divided reticle assembly, each of the reticle portions typically is divided into respective subfields each defining a respective portion of the pattern. With such a reticle assembly, the step of transferring the pattern portions comprises exposing the subfields individually to respective locations on the substrate so as to stitch together images of the respective portions of the pattern on the substrate. Also, each of the scattering-stencil reticle and scattering-membrane reticle portions of the reticle assembly can be configured as summarized above with respect to reticle assemblies. In general, each scattering-stencil reticle portion comprises a respective reticle membrane defining pattern elements by respective through-holes in the reticle membrane, and each scattering-membrane reticle portion comprises a respective reticle membrane including a pattern-defining layer made of a material different from a material used to form the respective reticle membrane.

Also provided are apparatus for performing a fabrication process on a wafer as required to produce a microelectronic device on the wafer. An embodiment of such an apparatus comprises an EB optical system and a scattering-reticle assembly situated relative to the EB optical system and defining a pattern that is projection-transferred to a substrate by an energy beam passing through the EB optical system. The scattering-reticle assembly comprises at least one scattering-stencil reticle portion defining a respective portion of the pattern, and at least one scattering-membrane reticle portion defining a respective portion of the pattern. The scattering-reticle assembly can further comprise a support frame, wherein the at least one scattering-stencil reticle portion and the at least one scattering-membrane reticle portion are bonded to respective locations on the support frame. Each of the scattering-stencil reticle and scattering-membrane reticle portions of the reticle assembly can be configured as summarized above with respect to reticle assemblies.

Also provided are methods for fabricating a reticle assembly defining a pattern to be transferred microlithographically to a substrate using an electron beam. In an embodiment of such a method, a scattering-stencil reticle portion is fabricated that defines a first portion of the pattern. Also, a scattering-membrane reticle portion is fabricated that defines a second portion of the pattern. The scattering-stencil reticle portion and the scattering-membrane reticle portion are attached to a reticle frame. Each of the scattering-stencil reticle and scattering-membrane reticle portions of the reticle assembly can be configured as summarized above with respect to reticle assemblies.

With any of the reticle assemblies summarized above, the need to stitch together complementary pattern portions on the reticle is not increased over the need experienced with conventional reticles. In fact, the need for such stitching usually is reduced compared to what is encountered with conventional scattering-stencil reticles. In addition, reticle assemblies as summarized above do not produce increased chromatic aberrations. Hence, by including at least one of each type of scattering reticle on a single reticle assembly, it is now possible to compensate for the shortcomings of the two types of scattering reticles.

The foregoing and additional features and advantages of the invention will be more readily apparent from the following detailed description, which proceeds with reference to the accompanying drawings.

BRIEF DESCRIPTIONS OF THE DRAWINGS

Figure 3A:
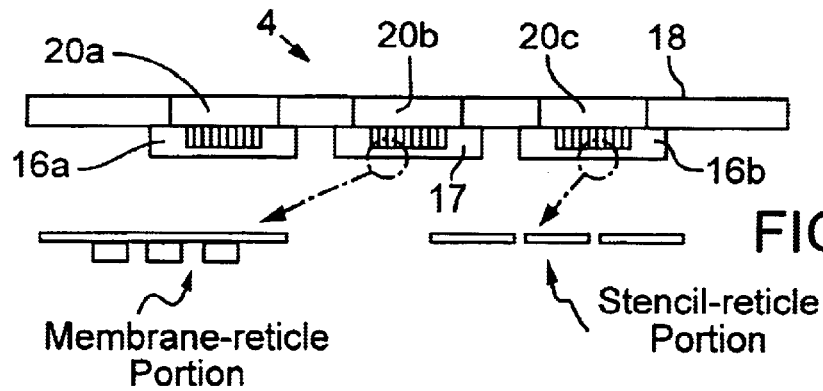
Figure 3B:
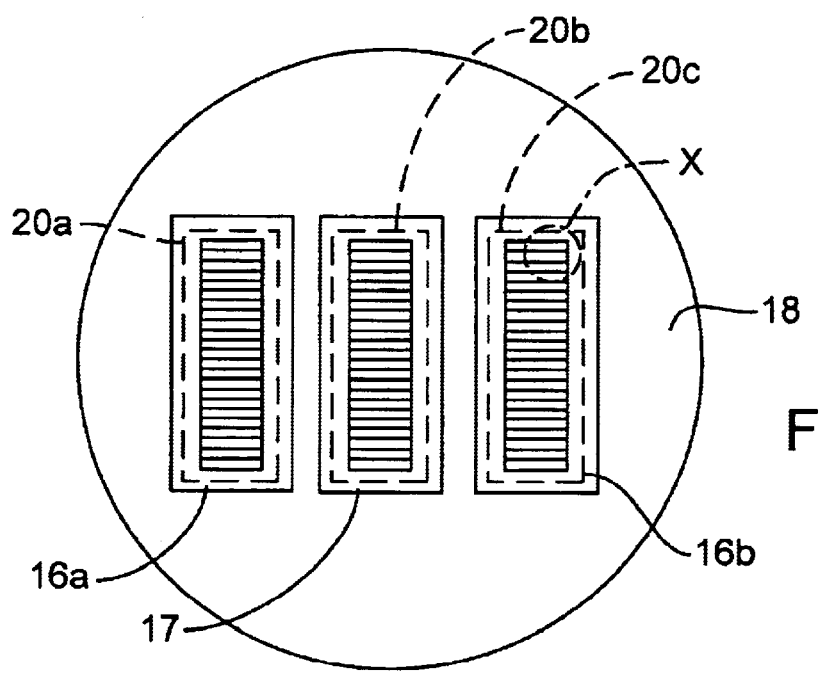
Figure 3C:
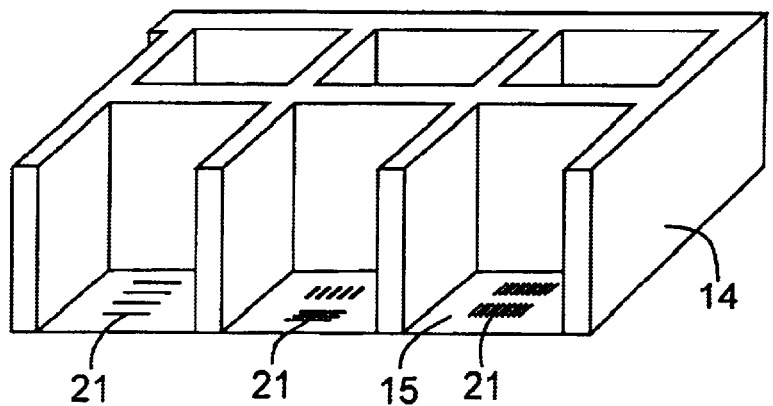

FIGS. 3(A)–3(C) depict a scattering-reticle assembly according to a representative embodiment. FIG. 3(A) is an elevational view of the reticle assembly comprising two scattering-stencil portions and one scattering-membrane reticle portion, FIG. 3(B) is a plan view of the reticle assembly, and FIG. 3(C) is an enlarged oblique view of part X in FIG. 3(B).

Figure 4A:
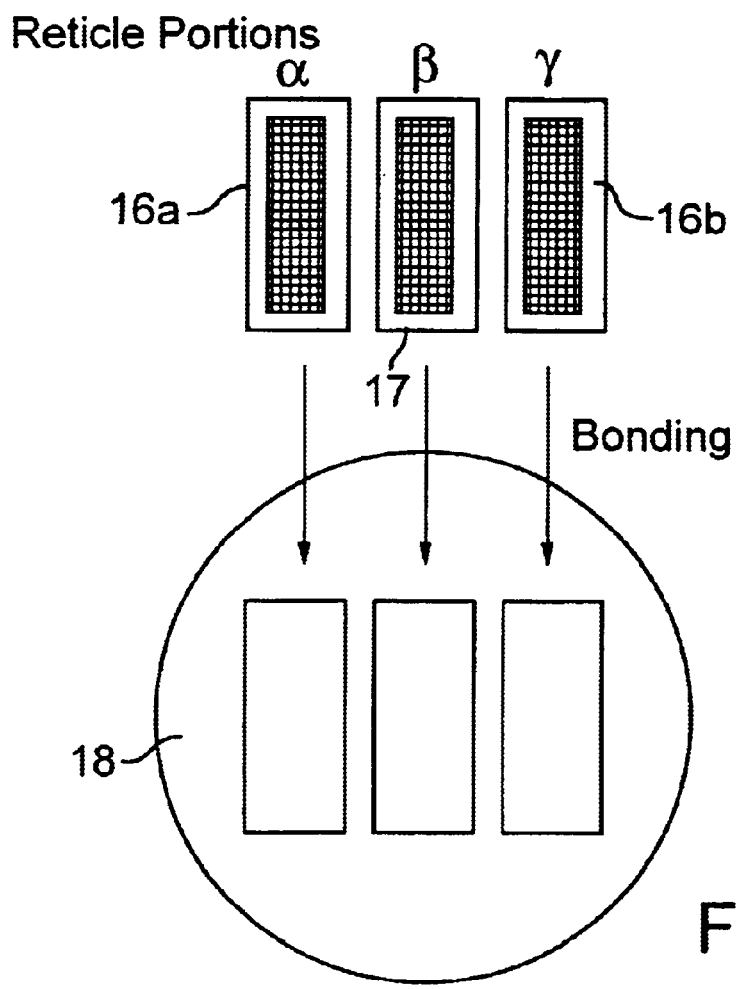
Figure 4B:
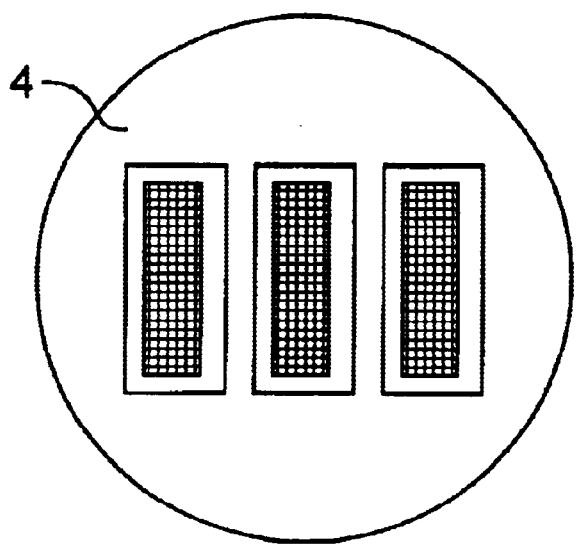

FIGS. 4(A) and 4(B) are plan views of certain steps in a method for making a scattering-reticle assembly according to a representative embodiment.

DETAILED DESCRIPTION

According to an important aspect of the invention, multiple types of scattering reticles are supported as a "reticle assembly" on a reticle stage of an EB projection-microlithography apparatus. During exposure of a substrate with the pattern defined by the reticle assembly, the appropriate reticle type is selected for respective portions of the pattern, thereby compensating for the shortcomings of each of the different types of scattering reticles and thus achieving a higher-quality lithographic result on the substrate.

By way of example, a scattering-stencil reticle portion and a scattering-membrane reticle portion are configured for mounting to a reticle frame or analogous support. In the resulting reticle assembly, each reticle portion defines a respective portion of the overall pattern defined by the reticle assembly. This reticle assembly can be mounted to a reticle stage of an electron-beam (EB) microlithography apparatus. Since the respective fabrication processes for manufacturing scattering-stencil reticles and scattering-membrane reticles are different, each reticle portion can be manufactured separately and then mounted in the reticle frame or analogous support to form the reticle assembly.

Figure 1:
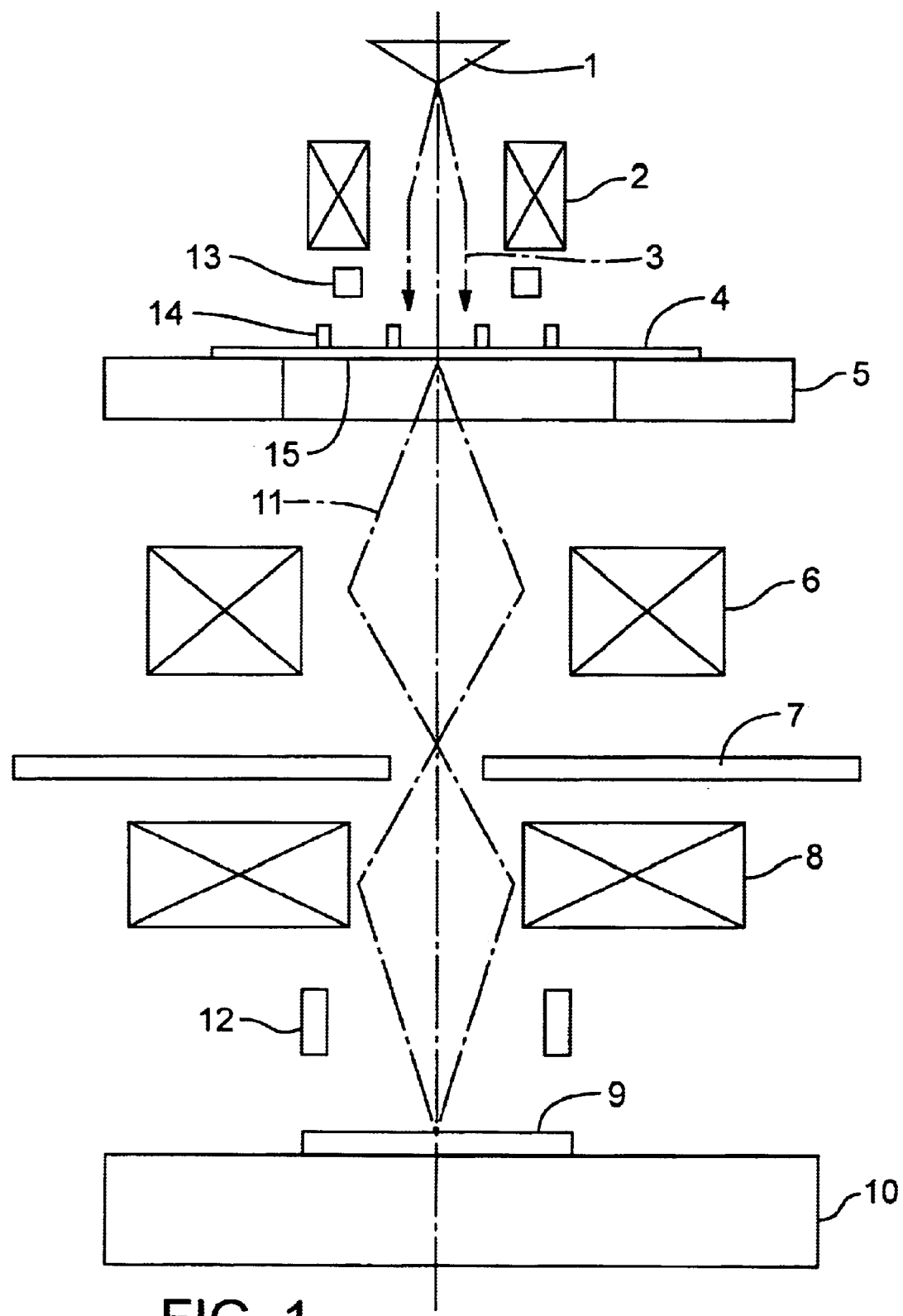
FIG. 1 is a schematic elevational diagram showing a representative structure of an electron-beam (EB) projection-microlithography apparatus (more specifically a demagnifying batch-exposure apparatus employing a divided or "segmented" reticle), with which a scattering reticle assembly according to a representative embodiment of the invention can be used.

A representative embodiment of a projection-microlithography apparatus with which a reticle assembly as summarized above can be used is shown in FIG. 1. The depicted apparatus utilizes an electron beam as a microlithographic energy beam. At the extreme downstream end of the apparatus a substrate 9 (or "wafer," generally the object to be exposed with an image of a pattern) is mounted on a wafer stage 10. At the extreme upstream end, an electron gun 1 is situated. The electron gun 1 is the source of an "illumination beam" 3 directed toward a reticle assembly 4 mounted on a reticle stage 5.

Between the electron gun 1 and the reticle assembly 4 is an illumination system 2 situated and configured to receive the illumination beam 3 from the electron gun 1 and to collimate the illumination beam 3 for incidence on a selected region of the reticle assembly 4. A deflector 13 is situated downstream of the illumination system 2 and configured to regulate the size of the "batch-transfer region" (i.e., the pattern portion, usually termed a "subfield," on the reticle assembly 4 illuminated at a given instant by the illumination beam 3).

Figure 2:
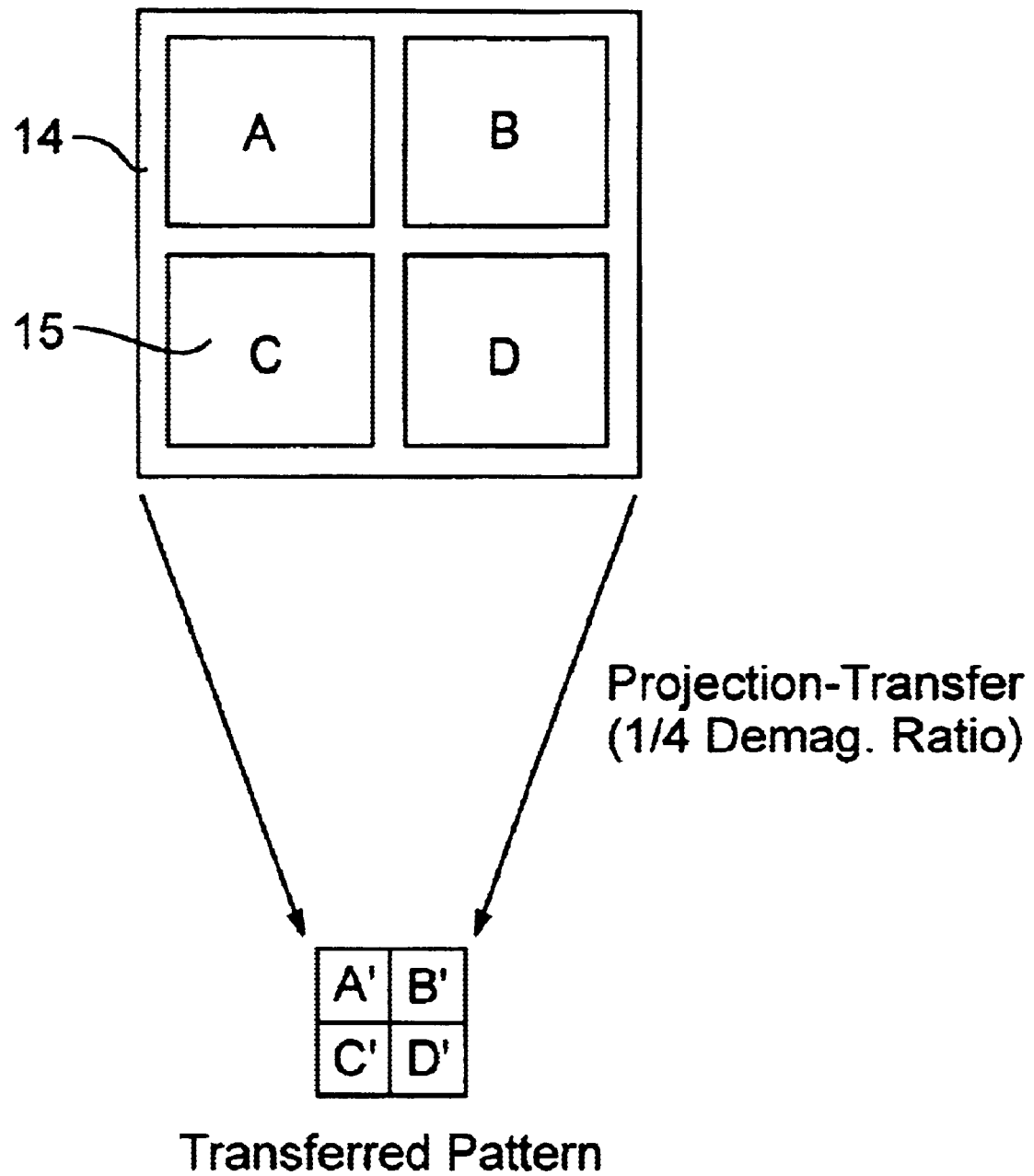
FIG. 2 is a plan view useful for describing certain basic exposure principles of electron-beam batch exposure.

Representative subfields 15 are shown in FIG. 2, depicting a portion of a reticle. The depicted portion includes four subfields 15 labeled A, B, C, and D, respectively. As is usual with a segmented reticle, the subfields A, B, C, D are separated from each other by struts 14 (discussed further below). Note that struts 14 and subfields 15 also are shown in the reticle 4 mounted to the reticle stage 5 in FIG. 1. During projection microlithography performed using the depicted reticle portion, the image formed on the wafer (lower region in the figure) usually is "reduced" (demagnified) by a factor such as 1/4. This factor is termed the "demagnification ratio." The images of the subfields A, B, C, D are formed on the wafer surface as corresponding "transfer subfields" A', B', C', D' that are situated contiguously on the wafer surface without intervening struts.

The image of the illuminated portion of the reticle assembly 4 is formed on the wafer 9 by the portion of the EB-optical system located between the reticle stage 5 and the wafer stage 10. This portion, termed the "projection system," includes a first projection lens 6, a scatter-blocking aperture 7, a second projection lens 8, and a deflector 12. In a projection-microlithography apparatus configured in this manner electrons of the illumination beam 3 that pass through the reticle 4 become a "patterned" or "imaging" beam 11. The patterned beam 11 carries an image of the illuminated portion of the reticle 4. The image is formed on the surface of the wafer 9 by the projection lenses 6, 8.

A representative embodiment of a reticle assembly 4 is shown in FIGS. 3(A)–3(C). The depicted reticle assembly, by way of example, has a diameter of 200 mm and a maximal thickness of 5 mm. The reticle assembly 4 includes a silicon support frame 18 that defines, in this example, three openings 20a, 20b, 20c each configured to receive a respective reticle portion. In the figure the openings 20a and 20c have associated therewith stencil-reticle portions 16a, 16b, respectively, and the opening 20b has associated therewith a membrane-reticle portion 17. (The two stencil-reticle portions 16a, 16b can be used to define pattern elements that are complementary to each other. I.e., the second stencil-reticle portion 16b can comprise subfields defining respective pattern features that are complementary to respective pattern features defined in subfields of the first stencil-reticle portion 16a.) Each reticle portion 16a, 16b, 17 is bonded to the support frame 18 (e.g., by adhesive bonding) such that the reticle portions extend across the respective opening. In this example, the membrane-reticle portion 17 is situated between the stencil-reticle portions 16a, 16b, but this is not intended to be limiting in any way.

FIG. 3(C) provides an enlarged detailed view of a portion, denoted "X," of the reticle portion 16b in FIG. 3(B). FIG. 3(C) shows more clearly how the struts 14 divide the reticle portion into multiple individual subfields 15 each defining a respective portion of the overall pattern. In each subfield 15, a respective membrane extends across each opening defined by the struts 14. Hence, the struts 14 collectively provide substantial mechanical strength and rigidity to the membranes. Since the reticle portion 16b is a scattering-stencil reticle, it can be seen in FIG. 3(C) that pattern elements 21 defined by each respective membrane are configured as respective through-holes in the membrane. In an actual reticle, each subfield 15 would have a size of 1-mm square, for example.

A representative method for fabricating stencil-reticle portions 16a, 16b is set forth in Uchikawa, et al., *J. Vac. Sci. Technol.* B17:2868 (1999). Each of the stencil-reticle portions 16a, 16b includes an electron-scattering membrane in which electron-transmissive through-holes define respective pattern elements. The membrane desirably is made of silicon (Si).

A representative method for fabricating a membrane reticle is set forth in Dicks et al., *Jpn. J. Appl. Phys.* 36:7564 (1997). The membrane-reticle portion 17 includes a thin electron-transmissive reticle membrane made of Si, SiC, SiN, carbon (e.g., diamond), and BN, for example (or a mixture thereof). On the reticle membrane is a pattern-defining layer made of Cr, W, Ta, or a mixture thereof. I.e., the pattern-defining layer is broken up into "scattering bodies" that, together with intervening spaces formed by the reticle membrane, define the pattern elements of the respective portion of the pattern defined by the membrane reticle. The pattern-defining layer tends to scatter incident electrons. Desirably, the pattern-defining layer has a transmittance, to electrons of an incident electron beam, of no more than one-tenth of the electron-transmittance of the reticle membrane so as to enhance the contrast of the pattern image.

The particular reticle type that is used for defining a particular portion of the pattern can be selected based on the characteristics of the pattern portion. For example, a stencil-type reticle is desirable for defining fine pattern elements, and a membrane-type reticle is desirable for defining relatively large pattern elements that extend across relatively wide areas. For example, a pattern for a layer of a logic circuit having a minimum line width of 70 nm desirably utilizes the stencil-type reticle for defining pattern elements that are 90 nm and smaller, such as gates; other portions of the pattern can be defined using the membrane-type reticle. The choice of reticles also will hinge on whether a respective pattern element must be divided into complementary pattern-element portions or whether the pattern element can be defined without having to divide it in this manner.

In FIG. 4(A), reticles α and γ are respective stencil-reticle portions 16a, 16b, respectively, and the reticle β is a respective membrane-reticle portion 17. Each of the reticles α, β, γ desirably is bonded to the support frame 18 using a suitable adhesive or the like, thereby yielding the reticle assembly 4 shown in FIG. 4(B). Bonding of the reticles α, β, γ to the support frame desirably is performed at normal room temperature. Examples of suitable bonding methods that can be performed at this temperature include polar bonding and eutectic bonding. Bonding at normal room temperature prevents reticle deformation that otherwise would occur if the reticle temperature were allowed to increase during bonding.

Thus, in this embodiment, at least one each of two types of reticles are bonded to the support frame 18 to make a single scattering-reticle assembly 4. The reticle assembly 4 is held on the reticle stage 5 of an EB projection-microlithography apparatus (stepper) and used for transfer-exposing a pattern from the reticle assembly 4 to a wafer 9.

Next, relevant operational aspects of a projection-microlithography apparatus utilizing a reticle assembly 4 as described above are explained. Referring to the projection-microlithography apparatus of FIG. 1, exemplary parameters are as follows: beam-acceleration voltage is 100 kV, demagnification ratio is 1/4, the subfield size on the reticle is 1-mm square (yielding an image size on the wafer of 0.25-mm square), the beam current on the reticle is about 10 $\mu$A per subfield, and the resist sensitivity on the wafer is 10 $\mu$C/cm$^2$. The electron beam 3 emitted from the electron gun 1 is collimated by passage through the illumination system 2 for illuminating a preselected subfield 15 on the reticle assembly 4. The deflector 13 deflects the illumination beam as required to illuminate the preselected subfield. An image of the illuminated subfield is focused on the wafer 9 by the collective action of the projection lenses 6 and 8. The deflector 12 deflects the patterned beam at a respective angle and magnitude of deflection to place the image at a preselected location on the wafer.

During exposure, as shown in FIG. 2, images of the struts 14 on the reticle assembly 4 are not formed on the wafer. Thus, images of the subfields A, B, C, and D are projected to respective transfer subfields A', B', C', D' on the wafer. The images A', B', C', D' are formed ("stitched together") immediately adjacent to and contiguously with each other, with no intervening images of the struts 14.

As noted above, the reticle assembly 4 includes multiple types of scattering reticles. In the disclosed embodiment, the membrane areas of the stencil-reticle portions 16a, 16b forward-scatter electrons of the incident beam. Similarly, with respect to the membrane-reticle portion 17, the membrane areas including respective scattering bodies forward-scatter electrons of the incident illumination beam. The forward-scattered electrons are blocked by the scatter-blocking aperture 7. As a result, most of the forward-scattered electrons do not participate in image formation on the wafer.

With a scattering-membrane reticle, electrons incident on the membrane portion also are forward-scattered as they pass through the membrane portion. Hence, with a given incident beam, a scattering-membrane reticle does not provide the same irradiation conditions on the wafer as a scattering-stencil reticle. To compensate for this difference, during use of the scattering-stencil reticle, the illumination beam can be blanked and exposure time can be shortened, so as to achieve the same exposure as achieved by the scattering-membrane reticle. Thus, the exposure using either type of reticle is made the same or at least controlled to achieve optimal exposure results.

By using a scattering-reticle assembly according to this embodiment, transfer of a pattern by EB microlithography can be performed using a single reticle assembly that includes at least one scattering-stencil reticle and at least one scattering-membrane reticle each defining a respective portion of the pattern. The particular pattern portions to be defined by each reticle are selected so as to take advantage of the benefits of each type of reticle during exposure and to achieve maximal compensation for the shortcomings of each type of reticle. Thus, for example, pattern transfer can be achieved while minimizing the amount of stitching required of complementary pattern portions and while minimizing chromatic aberrations.

It will be understood that the invention is not limited to the representative embodiments described above. On the contrary, any of various modifications alternatively can be selected such as changes in materials, dimensions, quantities, and configurational aspects, while remaining encompassed by the spirit and scope of the invention.

Furthermore, a reticle assembly such as the particular embodiment described above can be used in any of various lithographic exposure apparatus as used, for example, in manufacturing microelectronic devices. The subject lithographic exposure apparatus can include any of various reticle-washing devices, resist-coating devices, film-forming devices, or other peripheral equipment.

What is claimed is:

1. In an electron-beam (EB) microlithographic exposure method in which an electron beam is directed to a reticle assembly, defining a pattern, so as to acquire an ability to form an image of the pattern on a substrate, an improvement comprising:

on the reticle assembly defining a first pattern portion on at least one scattering-stencil reticle portion and defining a second pattern portion on at least one scattering-membrane reticle portion; and using the electron beam, transferring the pattern portions from each reticle portion to the substrate so as to produce a stitched-together image of the pattern on the substrate.

2. The method of claim 1, wherein:

each of the reticle portions is divided into respective subfields each defining a respective portion of the pattern; and the step of transferring the pattern portions comprises exposing the subfields individually to respective locations on the substrate so as to stitch together images of the respective portions of the pattern on the substrate.

3. The method of claim 1, wherein:

each scattering-stencil reticle portion comprises a respective reticle membrane defining pattern elements by respective through-holes in the reticle membrane; and each scattering-membrane reticle portion comprises a respective reticle membrane including a pattern-defining layer made of a material different from a material used to form the respective reticle membrane.

* * * * *